(12) United States Patent
Zheng et al.

(10) Patent No.: US 11,602,073 B2
(45) Date of Patent: Mar. 7, 2023

(54) HEAT DISSIPATING SYSTEM AND POWER CABINET

(71) Applicant: Sungrow Power Supply Co., Ltd., Hefei (CN)

(72) Inventors: Hao Zheng, Anhui (CN); Xiaohu Wang, Anhui (CN); Qiyao Zhu, Anhui (CN); Rubin Wan, Anhui (CN); Jun Tan, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 0 days.

(21) Appl. No.: 17/212,970

(22) Filed: Mar. 25, 2021

(65) Prior Publication Data
US 2021/0378153 A1 Dec. 2, 2021

(30) Foreign Application Priority Data

May 27, 2020 (CN) .................. 202020931151.X

(51) Int. Cl.
*H05K 7/20* (2006.01)

(52) U.S. Cl.
CPC ......... *H05K 7/202* (2013.01); *H05K 7/20172* (2013.01); *H05K 7/20909* (2013.01); *H05K 7/206* (2013.01)

(58) Field of Classification Search
CPC ..... H05K 7/202; H05K 7/20909; H02B 1/565
See application file for complete search history.

(56) References Cited

U.S. PATENT DOCUMENTS

| | | | | |
|---|---|---|---|---|
| 5,806,583 A | * | 9/1998 | Suzuki | H01L 23/467 |
| | | | | 165/104.34 |
| 5,832,988 A | * | 11/1998 | Mistry | H05K 7/206 |
| | | | | 165/104.34 |
| 7,312,993 B2 | * | 12/2007 | Bundza | H05K 7/206 |
| | | | | 165/122 |
| 9,229,498 B2 | * | 1/2016 | Chen | F25D 23/12 |
| 9,863,428 B2 | * | 1/2018 | Tsujimoto | H05K 7/206 |
| 9,974,214 B2 | * | 5/2018 | Hamah | H05K 7/206 |
| 10,462,938 B2 | * | 10/2019 | Wan | H05K 7/20181 |

FOREIGN PATENT DOCUMENTS

| | | | |
|---|---|---|---|
| CN | 102264212 A | * | 11/2011 |
| CN | 106659064 A | | 5/2017 |
| CN | 209358435 U | | 9/2019 |

OTHER PUBLICATIONS

Office Action for Indian Application No. 202144016076, dated Jan. 24, 2022.

* cited by examiner

*Primary Examiner* — Zachary Pape

(74) *Attorney, Agent, or Firm* — Wolf, Greenfield & Sacks, P.C.

(57) ABSTRACT

A heat dissipating system and a power cabinet are provided. The heat dissipating system includes a cabinet, a first circulating fan and a heat exchanger. The cabinet has an outer circulating air duct and a sealed inner circulating air duct. The air inlet and the air outlet connected to the outside are arranged in the outer circulating air duct, and the heat exchanger is arranged in the cabinet and configured to exchange heat between the inner circulating air duct and the outer circulating duct. The first circulating fan is arranged outside the air inlet of the outer circulating air duct or arranged inside the outer circulating air duct, and configured to supply air to the outer circulating air duct. The heat dissipation efficiency of the inner circulating air duct is improved.

10 Claims, 1 Drawing Sheet

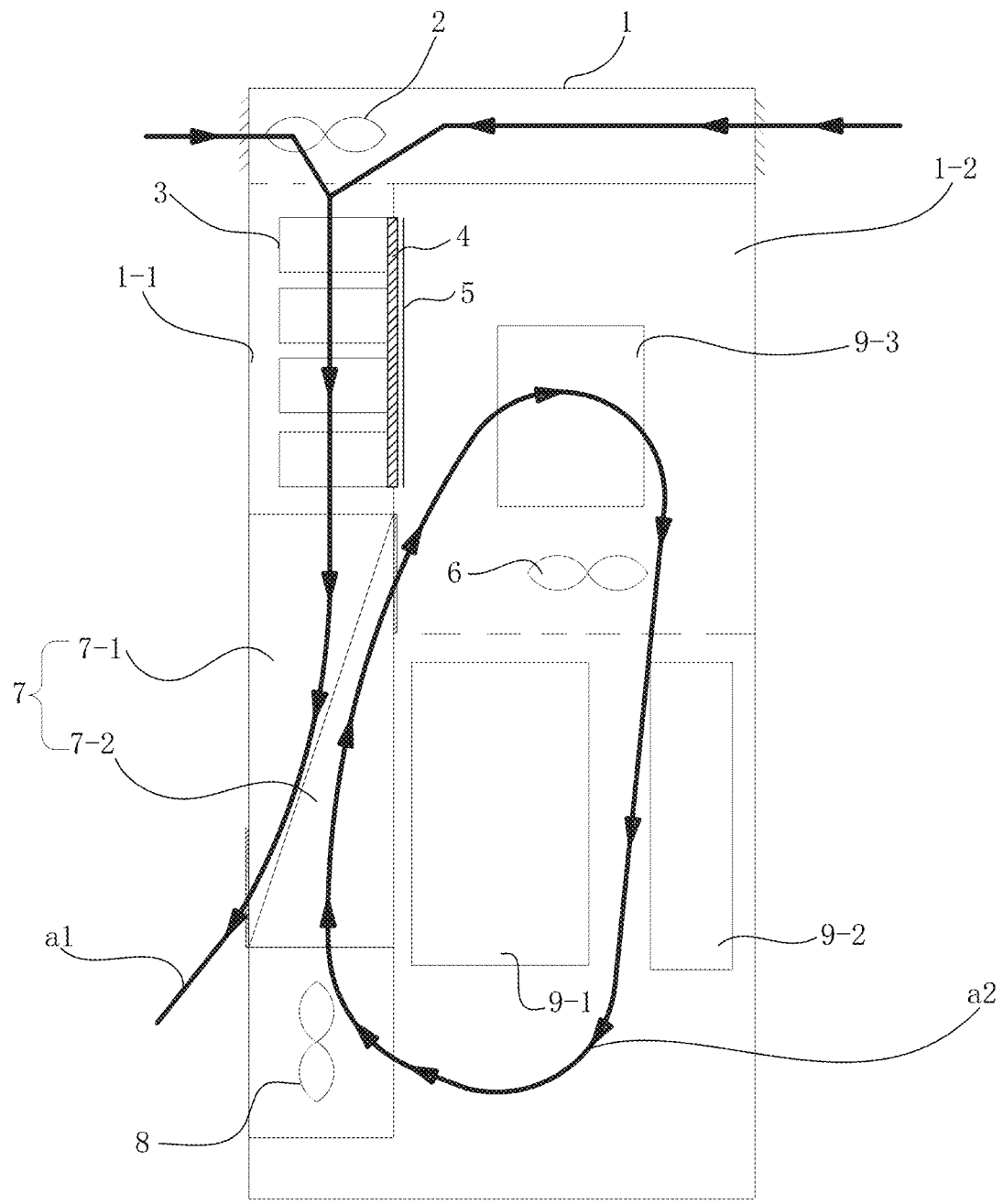

HEAT DISSIPATING SYSTEM AND POWER CABINET

CROSS REFERENCE TO RELATED APPLICATIONS

This application claims the priority to Chinese patent application No. 202020931151.X, titled "HEAT DISSIPATING SYSTEM AND POWER CABINET", filed with the China National Intellectual Property Administration on May 27, 2020, the entire disclosure of which is hereby incorporated by reference.

TECHNICAL FIELD

The present application relates to the technical field of electrical equipment, and in particular to a heat dissipating system and a power cabinet having the heat dissipating system.

BACKGROUND

Photovoltaic grid-connected inverters are interface equipment between a solar power generating system and a power grid. While ensuring circuit design and implement requirements, the photovoltaic grid-connected inverters also need to ensure the heat dissipation performance of the inverter power modules. The heat dissipation performance has an important impact on the working stability of the entire inverter system, product reliability, and the service life of power devices. A heat dissipating system is widely used for dissipating the power devices.

A conventional heat dissipating system is arranged with an outer circulating air duct connected with an outside and a sealed inner circulating air duct. The inner circulating air duct is arranged with a heating module, and the inner circulating air duct exchanges heat for heat dissipation through the sidewall connected the outer circulating air duct and the outer wall of the cabinet, and the heat dissipating system has low heat dissipation efficiency.

Therefore, how to improve the heat dissipation efficiency of the inner circulating air duct is a technical issue to be solved urgently by those skilled in the art.

SUMMARY

A heat dissipating system is provided by the present application, and the dissipation efficiency of an inner circulating air duct heat thereof is improved. A power cabinet having the heat dissipating system described above is further provided by the present application.

The present application provides a power cabinet, including a cabinet, a first circulating fan and a heat exchanger. The cabinet has an outer circulating air duct and a sealed inner circulating air duct. An air inlet and an air outlet connected to the outside are arranged on the outer circulating air duct, and the heat exchanger is arranged in the cabinet and configured to exchange heat between the inner circulating air duct and the outer circulating duct. The first circulating fan is arranged outside the air inlet of the outer circulating air duct or inside the outer circulating air duct, which is configured to supply air to the outer circulating air duct.

Preferably, the outer circulating air duct and the inner circulating air duct are both vertically arranged inside the cabinet, and the air inlet of the outer circulating air duct is arranged above the cabinet, and an air inlet duct communicated to the air inlet is arranged above the cabinet.

Preferably, the heat exchanger is an air-to-air heat exchanger.

Preferably, the heat exchanger is arranged on the sidewall of the cabinet, and the air outlet is an outlet of the heat exchanger.

Preferably, the heat dissipating system further includes a second circulating fan and an internal turbulence fan, and the second circulating fan and the internal turbulence fan are arranged in the inner circulating air duct.

Preferably, the second circulating fan is located at the air inlet inside the heat exchanger, and the second circulating fan is located at the bottom of the heat exchanger, the air outlet of the inner circulating air duct of the heat exchanger is located at the top of the sidewall of the heat exchanger.

A power cabinet, including the heat dissipating system described in any one of the above, a first heating device is arranged in the outer circulating air duct, and a second heating device is arranged in the inner circulating air duct.

Preferably, along the direction of the gas flow, a first heating device is arranged upstream of the heat exchanger of the outer circulating air duct, the first heating device is located above or below the heat exchanger.

Preferably, the first heating device is a capacitor component and a housing of the capacitor component is fixed and sealed in the outer circulating air duct.

Preferably, the outer circulating air duct and the inner circulating air duct are separated by a partition, and the housing of the capacitor component is arranged on the partition, the partition is arranged with a through-hole for the capacitor pool bus to pass through, and is sealed and connected to the sidewall of the capacitor pool bus.

Preferably, multiple sidewalls of the heat exchanger are respectively sealed and attached to the cabinet and the partition.

Preferably, at least two heating devices are arranged in the inner circulating air duct, and the second heating devices are arranged at least two layers from top to bottom, and the internal turbulence is arranged between two adjacent layers of the second heating devices.

Preferably, the protection level of the first heating device is higher than the protection level of the second heating device.

In the above technical solution, the heat dissipating system provided by the present application includes the cabinet, the first circulating fan and the heat exchanger. The cabinet has the outer circulating air duct and the sealed inner circulating air duct. The air inlet and the air outlet communicated to the outside are arranged in the outer circulating air duct, and the heat exchanger is arranged in the cabinet, which is configured to exchange heat between the inner circulating air duct and the outer circulating duct. The first circulating fan is arranged outside the air inlet of the outer circulating air duct or inside the outer circulating air duct, which is configured to supply air to the outer circulating air duct.

It can be seen from the above description that in the heat dissipating system provided in the application, by providing the heat exchanger for heat exchange of the gas between the inner circulating air duct and the outer circulating air duct, the high-temperature gas in the inner circulating air duct enters the heat exchanger and exchanges heat with the cold air entering through the outer circulating air duct of the heat exchanger, so that the hot air in the inner circulating air duct is converted into cold air, and the cold air in the outer circulating air duct is converted into hot air after heat exchange, which improves the heat dissipation efficiency of the inner circulating air duct. Moreover, the air in the inner circulating air duct of the cabinet is indirectly dissipated through the heat exchanger, that is, the inner circulating air duct of the cabinet does not contact the outside air, which satisfies the heat dissipation of the heating devices in the cabinet and improves the protection level of the entire cabinet.

BRIEF DESCRIPTION OF THE DRAWINGS

For more clearly illustrating embodiments of the present application or the technical solutions in the conventional technology, drawings to be used in the description of the embodiments or the conventional technology will be briefly described hereinafter. Apparently, the drawings in the following description are only some embodiments of the present application. For those skilled in the art, other drawings may be obtained based on the provided drawings without any creative work.

FIG. 1 is a schematic structural diagram of a power cabinet provided by an embodiment of the present application.

In FIG. 1:

1. cabinet;
1-1. outer circulating air duct;
1-2. inner circulating air duct;
2. first circulating fan;
3. first heating device;
4. rubber mat;
5. capacitor pool bus;
6. internal turbulence fan;
7. heat exchanger;
7-1. outer circulating air duct part;
7-2. inner circulating air duct part;
8. second circulating fan;
9-1. second heating device;
9-2. second heating device;
9-3. second heating device.

DETAILED DESCRIPTION OF THE EMBODIMENTS

A heat dissipating system is provided by the present application, whose inner circulating air duct heat dissipation efficiency is improved. A power cabinet having the heat dissipating system described above is further provided by the present application.

In order to enable those skilled in the art to better understand the technical solutions of the present application, the present application will be further described in detail in reference to the drawings and embodiments.

Referring to FIG. 1, in a specific embodiment, a heat dissipating system provided by a specific embodiment of the present application includes a cabinet 1, a first circulating fan 2 and a heat exchanger 7. The cabinet 1 has an outer circulating air duct 1-1 and a sealed inner circulating air duct. An air inlet and an air outlet connected to an outside are arranged on the outer circulating air duct 1-1, and the heat exchanger 7 is arranged in the cabinet 1 and configured to exchange heat between the inner circulating air duct and the outer circulating duct 1-1. The first circulating fan 2 is arranged outside the air inlet of the outer circulating air duct 1-1 or inside the outer circulating air duct 1-1, which is configured to supply air to the outer circulating air duct 1-1.

In specific use, a first heating device 3 is arranged in the outer circulating air duct 1-1, and a second heating device is arranged in the inner circulating air duct. The protection level of the first heating device 3 is higher than the protection level of the second heating device. That is, the second heating device with a lower protection level may be arranged in the inner circulating air duct in the present application for protecting the second heating device. The heating device 3 with a higher protection may be arranged in the outer circulating air duct 1-1, which is connected to the outside.

Specifically, the first circulating fan 2 may be arranged at the air inlet or outlet of the outer circulating air duct 1-1, and may also be arranged inside the outer circulation air duct 1-1.

Specifically, the heat exchanger 7 is an air-to-air heat exchanger, the inner circulating air duct part 7-2 of the heat exchanger 7 is in air communication with the inner circulating air duct, and the outer circulating air duct part 7-1 is in air communication with the outer circulating air duct 1-1.

In a specific embodiment, the outer circulating air duct 1-1 and the inner circulating air duct are separated by a partition, and the partition may be a plate structure.

In a specific embodiment, the second circulating fan 8 is located at the air inlet inside the heat exchanger 7, and the second circulating fan 8 is located at the bottom of the heat exchanger 7, the air outlet of the inner circulating air duct part 7-2 of the heat exchanger 7 is located at the top of a sidewall of the heat exchanger 7. By arranging the second circulating fan 8 at the air inlet inside the heat exchanger 7, the gas in the inner circulating air duct can smoothly enter the inner circulating air duct part 7-2 of the heat exchanger 7, so as to facilitate the heat dissipation.

Specifically, the sidewalls of the heat exchanger 7 are respectively sealed and attached to the cabinet 1 and the partition. That is, the gas in the outer circulating air duct 1-1 is exhausted through the outer circulating air duct part 7-1 of the heat exchanger 7, so as to prevent the gas in the outer circulating air duct 1-1 from accumulating in the cavity.

In a specific embodiment, the outer circulating air duct 1-1 and the inner circulating air duct are both vertically arranged inside the cabinet 1, and the air inlet of the outer circulating air duct 1-1 is arranged above the cabinet 1, and an air inlet duct connected to the air inlet is arranged above the cabinet 1.

It can be seen from the above description that in the heat dissipating system provided by the specific embodiment of the present application, high-temperature gas in the inner circulating air duct 1-2 enters the heat exchanger 7 and exchanges heat with the cold air entering through the outer circulating air duct 1-1 of the heat exchanger 7, so that the hot air in the inner circulating air duct 1-2 is converted into cold air, and the cold air in the outer circulating air duct 1-1 is converted into hot air after heat exchange, which improves the heat dissipation efficiency of the inner circulating air duct 1-2. Moreover, the air in the inner circulating air duct of the cabinet is indirectly dissipated through the heat exchanger, that is, the inner circulating air duct 1-2 of the cabinet 1 does not contact the outside air, which satisfies the heat dissipation of the heating devices in the cabinet 1 and improves the protection level of the entire cabinet.

In a specific embodiment, the heat exchanger 7 is arranged on the sidewall of the cabinet 1, and the air outlet is an outlet of the heat exchanger 7.

The present application adopts the indirect heat exchange method of the air-to-air heat exchanger 7, so that the inner circulating air duct avoids contact with the outside environment while ensuring the heat dissipation effect, thereby improving the protection performance of the power cabinet. At the same time, combined with the structural characteristics of the film capacitor itself, that is, the housing of the capacitor component has a good protection performance, and can be directly arranged in the outside environment, so that it can be arranged in the outer circulating air duct of the air-to-air heat exchanger, that is, the film capacitor is arranged in the outside environment to dissipate heat directly, which can improve the heat dissipation efficiency of the film capacitor effectively, and the entire cabinet 1 has a compact structure, which can increase the power density of the whole machine.

In a specific embodiment, the power cabinet further includes a second circulating fan 8 and an internal turbulence fan 6. The second circulating fan 8 and the internal turbulence fan 6 are arranged in the inner circulating air duct. Specifically, the second circulating fan 8 and the internal turbulence fan 6 are provided to facilitate heat exchange between the inner hot air and the outside through the heat exchanger 7 as soon as possible.

The power cabinet provided by the present application includes any one of the above heat dissipating system, a first heating device is arranged in the outer circulating air duct 1-1, and a second heating device is arranged in the inner circulating air duct. The foregoing describes the specific structure of the heat dissipating system. The present application includes the above heat dissipating system, which also has the above technical effects. Specifically, the first heating device 3 may be located above or below the heat exchanger 7.

In a specific embodiment, the protection level of the first heating device 3 is preferably greater than that of the second heating device.

In a specific embodiment, along the direction of the gas flow, a first heating device 3 is arranged upstream of the heat exchanger 7 of the outer circulating air duct 1-1. Specifically, the number of first heating device 3 may be one or at least two. When there are multiple first heating devices 3, the first heating devices 3 are arranged along the direction of the gas flow in sequence.

Specifically, the first heating device 3 is a capacitor component and the housing of the capacitor component is fixed and sealed arranged in the outer circulating air duct 1-1. Preferably, the housing of the capacitor component is arranged on the partition, the partition is arranged with a through-hole for the capacitor pool bus 5 to pass through, and is sealed and connected to the sidewall of the capacitor pool bus 5.

That is, an electrical connection part of the capacitor component is arranged in the inner circulating air duct, the capacitor component and the partition can be sealed and attached to the capacitor pool bus 5 by a rubber mad 4 or by means of pasting or gluing for ensuring the sealing of the inner and outer circulating air duct 1-1. Other devices, similar with capacitor structure in the cabinet 1 and heat generation characteristics, can be arranged in the outer circulating air duct 1-1, thereby improving the heat dissipation performance of devices and the protection performance of the cabinet 1.

Specifically, the capacitor of the capacitor component provided in the present application is a DC capacitor, specifically a film DC capacitor.

Specifically, at least two second heating devices 9-1, 9-2, 9-3 are arranged in the inner circulating air duct, and the second heating devices are arranged at least two layers from top to bottom, and the internal turbulence 6 is arranged between two adjacent layers of the second heating devices. There may be one or at least two second heating devices on each layer. The number of second heating devices on each layer can be determined according to the specific shape.

In the inner circulating air duct, the heat generated by the internal components of the cabinet 1, heats the air in the inner circulating air duct. Under the action of the second circulating fan 8, the inner hot air enters the heat exchanger 7, and exchanges heat with an outside, the inner hot air is cooled and converted into inner cold air. The inner cold air takes away the heat of the second heating devices under the action of the inner partition or the internal turbulence 6 to form inner hot air, which enters the second circulating fan 8 to form the inner air duct air circulation. In the outer circulating air duct 1-1, under the action of the first circulating fan 2, the outside cold air enters the outer circulating air duct. One part of the outside cold air contacts the housing of the capacitor component directly for heat exchange, the other part of the outside cold air and the cold air heated by the capacitor enter the heat exchanger 7. The outside hot air, passing through the heat exchanger 7, is discharged to the outside through the air outlet of the outer circulating air duct 1-1, and the heat is transferred to the outside to complete the circulation of the outer air duct.

Specifically, in the present application, the DC capacitor and the capacitor pool bus are sealed by the partition to achieve the sealing between the inner circulating air duct 1-2 and the outer circulating air duct 1-1. The housing part without no electrical connection part and high protection can be arranged in the outside environment, and the terminal part with electrical connection can be arranged in the inner environment, so as to satisfy the heat dissipation performance and the protection performance of the capacitor. The heat dissipation of the whole machine (excluding the DC capacitor part) is achieved by the indirect heat exchange between the air-to-air heat exchanger and the outside air, and the DC capacitor exchanges heat directly with the outside air.

Because the DC capacitor in the inverter unit is sensitive to temperature, plus the structure characteristics of the DC capacitor (its metal housing has a higher protection level), the DC capacitor can be arranged in the outer circulating air duct of the air-to-air exchanger, that is, the outside air can cool the DC capacitor directly to satisfy the heat dissipation performance of the DC capacitor. Some devices with lower protection level can be arranged in the inner circulating air duct of the air-to-air heat exchanger, and the heat of these devices can be taken away by the air-to-air heat exchanger, so as to satisfy the high protection of the entire cabinet 1.

The above embodiments are described in a progressive manner. Each of the embodiments is mainly focused on describing its differences from other embodiments, and reference may be made among these embodiments with respect to the same or similar parts.

The above illustration of the disclosed embodiments can enable those skilled in the art to implement or use the present application. Various modifications to the embodiments are apparent to the person skilled in the art, and the general principle herein can be implemented in other embodiments without departing from the spirit or scope of the present application. Therefore, the present application is not limited to the embodiments described herein, but should be in accordance with the broadest scope consistent with the principle and novel features disclosed herein.

The invention claimed is:

1. A power cabinet, comprising a heat dissipating system comprising a cabinet, a first circulating fan and a heat exchanger, wherein the cabinet has an outer circulating air duct and a sealed inner circulating air duct, an air inlet and an air outlet connected to an outside are arranged in the outer circulating air duct, and the heat exchanger is arranged in the cabinet and configured to exchange heat between the inner circulating air duct and the outer circulating duct, the first circulating fan is arranged outside the air inlet of the outer circulating air duct or inside the outer circulating air duct for supplying air to the outer circulating air duct, wherein a first heating device is arranged in the outer circulating air duct, and a second heating device is arranged in the inner circulating air duct, wherein along a direction of gas flow, the first heating device is arranged upstream of the heat exchanger of the outer circulating air duct, and the first heating device is located above or below the heat exchanger, wherein a protection level of the first heating device is higher than a protection level of the second heating device, wherein the heat exchanger is arranged on a sidewall of the cabinet, and the air outlet is an outlet of the heat exchanger.

2. The power cabinet according to claim 1, wherein the heat exchanger is an air-to-air heat exchanger.

3. The power cabinet according to claim 2, further comprising a second circulating fan and an internal turbulence fan, and the second circulating fan and the internal turbulence fan are arranged in the inner circulating air duct.

4. The power cabinet according to claim 1, further comprising a second circulating fan and an internal turbulence fan, and the second circulating fan and the internal turbulence fan are arranged in the inner circulating air duct.

5. The power cabinet according to claim 4, wherein the second circulating fan is located at the air inlet inside the heat exchanger, and the second circulating fan is located at the bottom of the heat exchanger, the air outlet of the inner circulating air duct of the heat exchanger is located at the top of a sidewall of the heat exchanger.

6. The power cabinet according to claim 1, wherein the first heating device is a capacitor component and a housing of the capacitor component is fixed, sealed, and arranged in the outer circulating air duct.

7. The power cabinet according to claim 6, wherein the outer circulating air duct and the inner circulating air duct are separated by a partition, and the housing of the capacitor component is arranged on the partition, the partition is arranged with a through-hole for a capacitor pool bus to pass through, and is sealed and connected to a sidewall of the capacitor pool bus.

8. The power cabinet according to claim 7, wherein sidewalls of the heat exchanger are respectively sealed and attached to the cabinet and the partition.

9. The power cabinet according to claim 1, wherein at least two heating devices are arranged in the inner circulating air duct, and a plurality of second heating devices are arranged at least two layers from top to bottom, and an internal turbulence fan is arranged between two adjacent layers of the plurality of second heating devices.

10. The power cabinet according to claim 4, further comprising a second circulating fan and an internal turbulence fan, and the second circulating fan and the internal turbulence fan are arranged in the inner circulating air duct.

* * * * *